(12) United States Patent
Kosugi

(10) Patent No.: US 11,164,812 B2
(45) Date of Patent: Nov. 2, 2021

(54) SEMICONDUCTOR DEVICE

(71) Applicant: Mitsubishi Electric Corporation, Tokyo (JP)

(72) Inventor: Akira Kosugi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/736,501

(22) Filed: Jan. 7, 2020

(65) Prior Publication Data
US 2020/0343173 A1 Oct. 29, 2020

(30) Foreign Application Priority Data
Apr. 26, 2019 (JP) .............................. JP2019-084802

(51) Int. Cl.
| | |
|---|---|
| *H01L 23/498* | (2006.01) |
| *H01L 23/31* | (2006.01) |
| *H01L 23/42* | (2006.01) |

(52) U.S. Cl.
CPC .... *H01L 23/49861* (2013.01); *H01L 23/3114* (2013.01); *H01L 23/42* (2013.01)

(58) Field of Classification Search
CPC . H01L 23/49861; H01L 23/3114; H01L 23/42
See application file for complete search history.

(56) References Cited

U.S. PATENT DOCUMENTS

| | | | | |
|---|---|---|---|---|
| 5,814,878 | A * | 9/1998 | Hirakawa | ............. H01L 21/565 257/667 |
| 2004/0145043 | A1* | 7/2004 | Hayashi | ................. H01L 24/49 257/696 |
| 2006/0056213 | A1* | 3/2006 | Lee | ........................ H01L 25/162 363/144 |
| 2013/0083492 | A1* | 4/2013 | Kim | .................... H01L 23/4334 361/728 |
| 2014/0055173 | A1* | 2/2014 | Shiraishi | ............... H03K 17/56 327/109 |

FOREIGN PATENT DOCUMENTS

| | | |
|---|---|---|
| JP | H05036745 A | 2/1993 |
| JP | H05095014 A | 4/1993 |

* cited by examiner

*Primary Examiner* — Peniel M Gumedzoe
(74) *Attorney, Agent, or Firm* — Studebaker & Brackett PC

(57) ABSTRACT

In a semiconductor device, lead frame includes a die pad. The die pad includes a mounting surface and a back surface. The mounting surface includes first and second mounting regions. The back surface includes first and second back regions. The first and second semiconductor elements are mounted on the first and second mounting regions, respectively. The first and second back regions are located on opposite sides from the first and second mounting regions, respectively. The mold resin has the first semiconductor element, the second semiconductor element, and the die pad encapsulated therein and is in direct contact with the second back region. The insulation sheet is disposed on the first back region to be exposed outside the mold resin, the insulation sheet having a thermal conductivity higher than a thermal conductivity of the mold resin.

8 Claims, 5 Drawing Sheets

F I G. 3
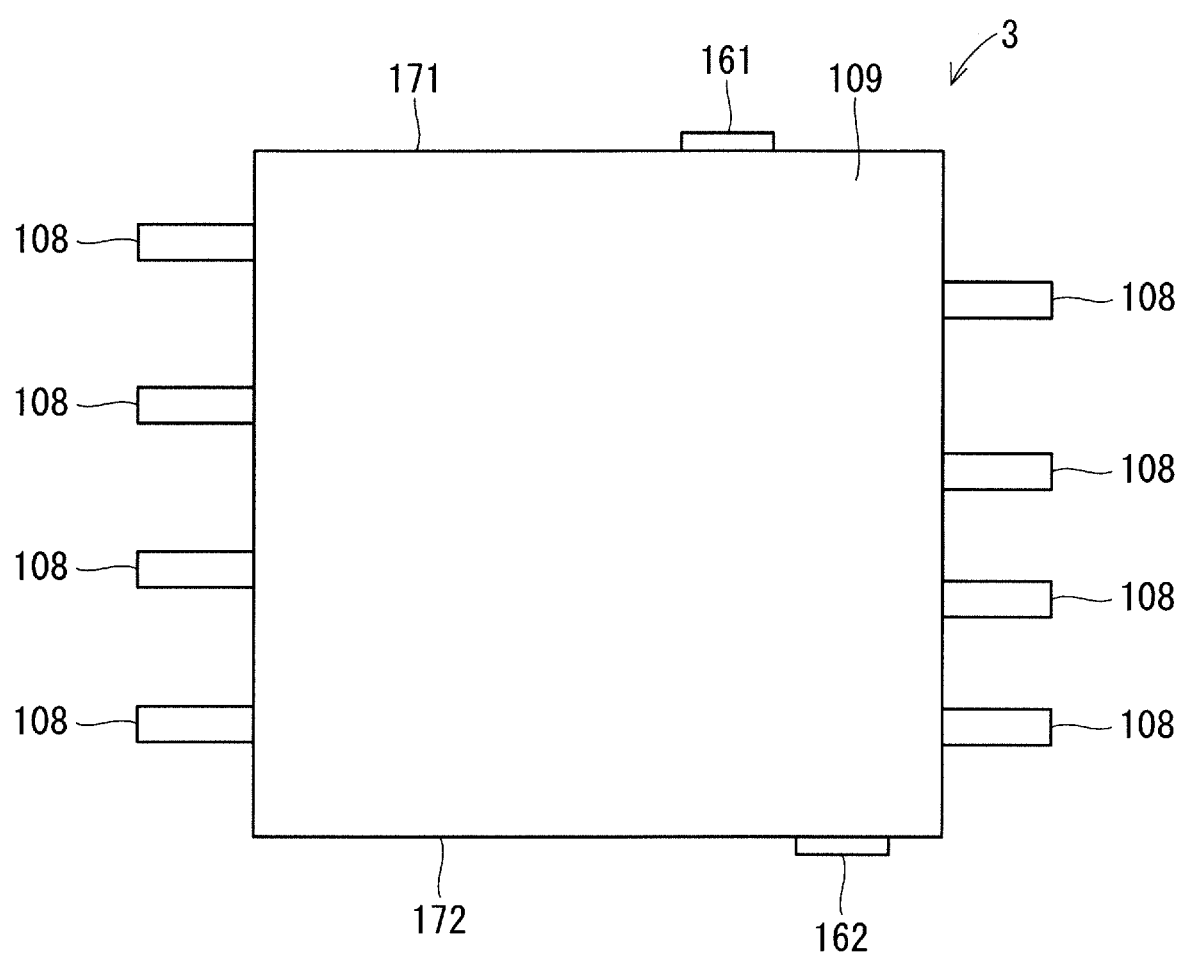

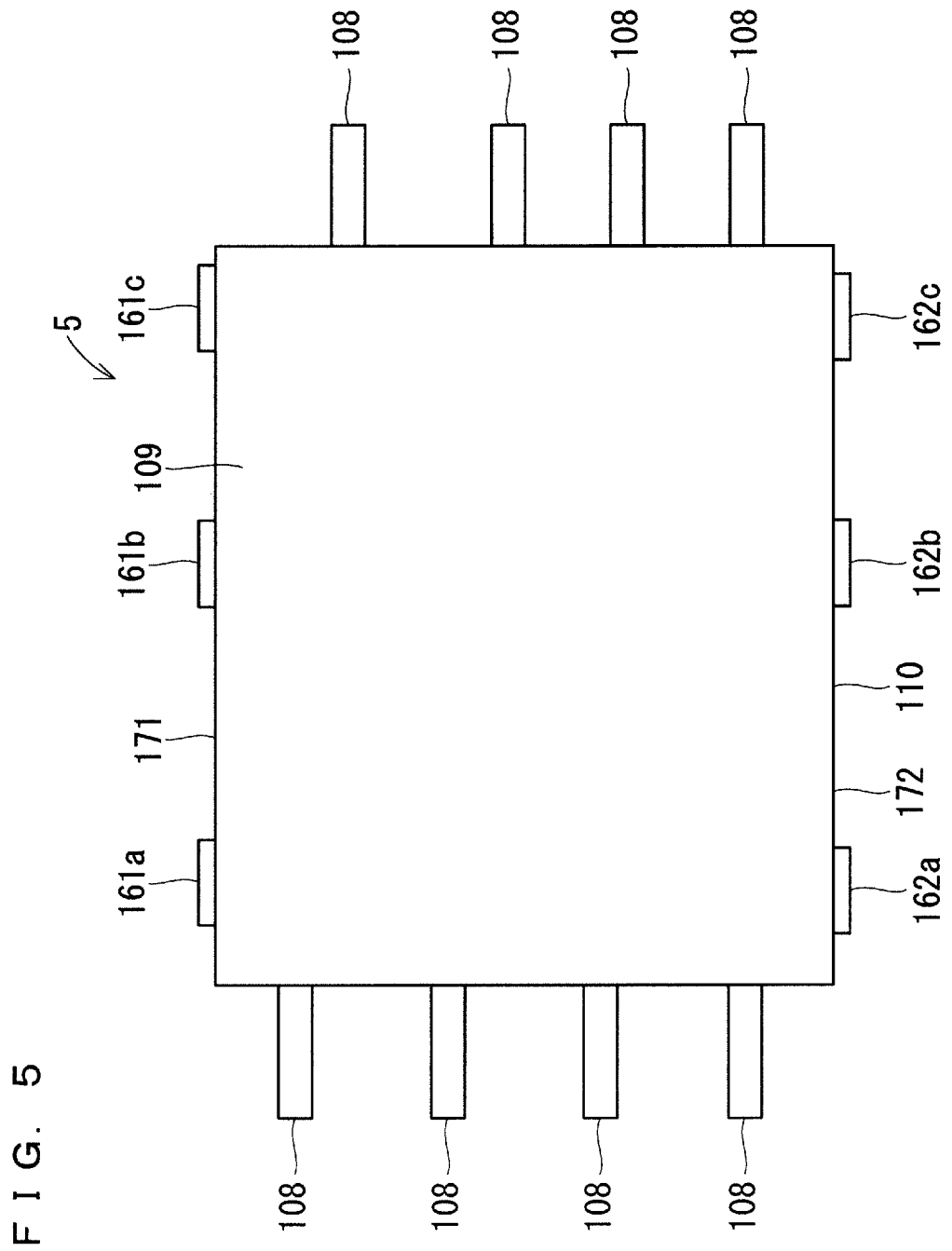

SEMICONDUCTOR DEVICE

BACKGROUND OF THE INVENTION

Field of the Invention

The present invention relates to a semiconductor device.

Description of the Background Art

In many cases, a semiconductor device includes a semiconductor element, a lead frame, and a mold resin. The semiconductor element is mounted on a mounting surface of a die pad of the lead frame. The mold resin has the semiconductor element and the die pad encapsulated therein. In many cases, the mold resin is formed by transfer molding. However, when the mold resin is formed by transfer molding, resin may not be properly charged. For example, an unfilled portion, a void, or the like may be formed at an area where it is difficult to charge the resin. For this reason, methods for properly charging resin have been considered.

For example, in the technique disclosed in Japanese Patent Application Laid-Open No. H05-036745 (1993), a thin semiconductor device includes a semiconductor chip, a lead frame, and a package part (paragraphs 0007 and 0008). When the package part is formed, molten resin flows into a cavity through a resin inflow gate (paragraph 0007). Further, part of the molten resin that has flowed into the cavity flows out from a resin outflow gate provided diagonally opposite the resin inflow gate (paragraph 0007). Further, the molten resin that has flowed out is stored in a resin gathering part (paragraph 0007). The technique disclosed in Japanese Patent Application Laid-Open No. H05-036745 (1993) allows the molten resin to flow within the cavity, thereby allowing a uniform package part without a resin-unfilled portion to be easily formed (paragraphs 0006 and 0009).

Further, in the technique disclosed in Japanese Patent Application Laid-Open No. H05-095014 (1993), a semiconductor device includes a semiconductor pellet, a lead frame, and an encapsulation body (paragraphs 0019 and 0032). When the encapsulation body is formed, resin is injected into a cavity through a gate (paragraph 0019). The resin that has flowed out of the cavity is injected into a flow cavity (paragraph 0020).

On the other hand, a semiconductor device such as an intelligent power module including a drive circuit and a protection circuit for a semiconductor element needs to have not only high insulation that allows the semiconductor element and the die pad to be satisfactorily insulated from the outside, but also high heat dissipation that allows heat generated by the semiconductor element to be satisfactorily dissipated to the outside of the mold resin. For this reason, it is not sufficient for the semiconductor device to dissipate, through the mold resin having low thermal conductivity, the heat generated by the semiconductor element to the outside of the mold resin. To address such a problem, the semiconductor device includes an insulation sheet that has high thermal conductivity and is disposed on a back surface of the die pad to be exposed outside the mold resin.

In many cases, a semiconductor device such as an intelligent power module includes a plurality of semiconductor elements. For this reason, when the semiconductor device includes the above-described insulation sheet, an area where the insulation sheet is disposed increases, and thus the cost of the semiconductor device cannot be reduced.

SUMMARY

An object of the present invention is to reduce a cost of a semiconductor device having high heat dissipation and high insulation.

The present invention relates to a semiconductor device.

The semiconductor device includes a first semiconductor element, a second semiconductor element, a lead frame, a mold resin, and an insulation sheet. The lead frame includes a die pad. The die pad includes a mounting surface and a back surface. The mounting surface includes first and second mounting regions. The back surface includes first and second back regions. The first and second semiconductor elements are mounted on the first and second mounting regions, respectively. The first and second back regions are located on opposite sides from the first and second mounting regions, respectively. The mold resin has the first semiconductor element, the second semiconductor element, and the die pad encapsulated therein and is in direct contact with the second back region. The insulation sheet is disposed on the first back region to be exposed outside the mold resin, the insulation sheet having a thermal conductivity higher than a thermal conductivity of the mold resin.

Heat generated by the first semiconductor element is satisfactorily dissipated, through the insulation sheet having a thermal conductivity higher than a thermal conductivity of the mold resin, to the outside of the mold resin. This makes it possible to provide the semiconductor device having high heat dissipation.

Further, the first semiconductor element, the second semiconductor element, and the die pad are satisfactorily insulated from the outside by the mold resin and the insulation sheet. This makes it possible to provide the semiconductor device having high insulation.

Further, no insulation sheet is disposed on the second back region. This makes it possible to reduce the number of insulation sheets and in turn makes it possible to reduce the cost of the semiconductor device.

Further, heat generated by the second semiconductor element can be satisfactorily dissipated, through the mold resin, to the outside of the mold resin. Accordingly, the structure where no insulation sheet is disposed on the second back region does not prevent provision of the semiconductor device having high heat dissipation.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a plan view schematically showing a semiconductor device according to a third preferred embodiment;

FIG. 5 is a plan view schematically showing a semiconductor device according to a fifth preferred embodiment.

DESCRIPTION OF THE PREFERRED EMBODIMENTS

1 First Preferred Embodiment

Figure 1:
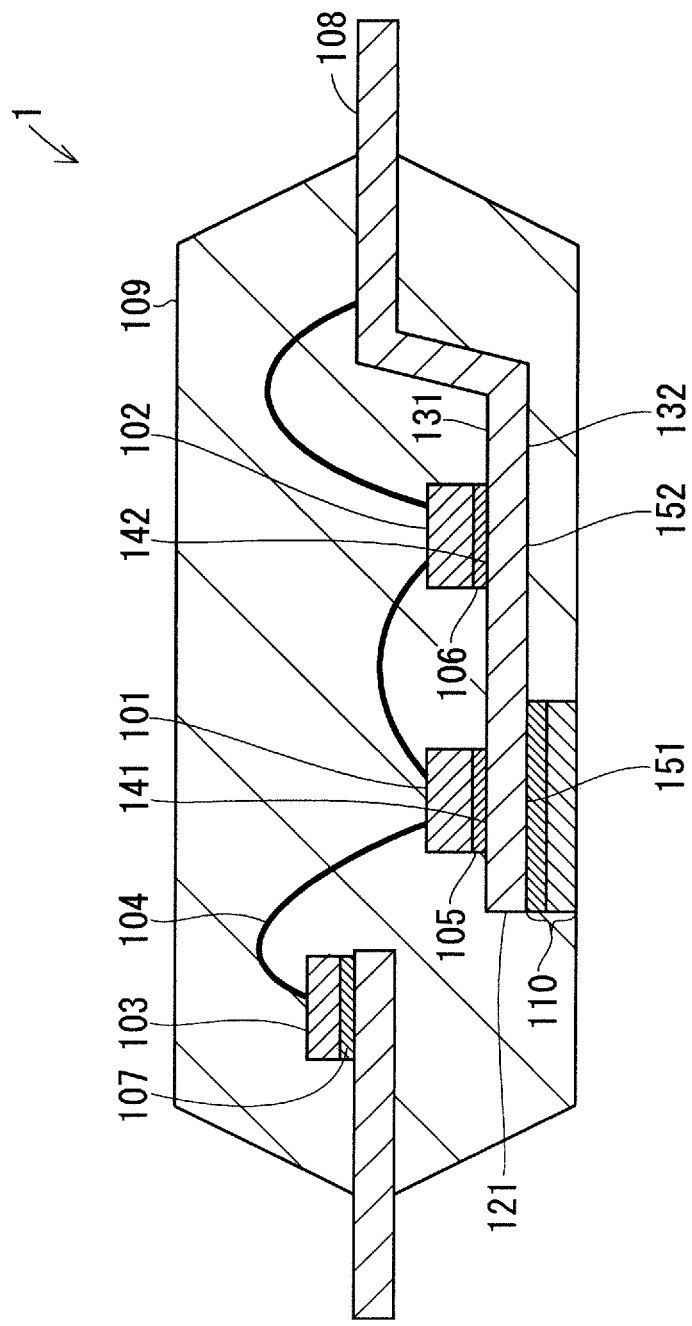
FIG. 1 is a cross-sectional view schematically showing a semiconductor device according to a first preferred embodiment.

FIG. 1 is a cross-sectional view schematically showing a semiconductor device according to a first preferred embodiment.

A semiconductor device 1 according to the first preferred embodiment shown in FIG. 1 is a power module or the like.

The semiconductor device 1 includes a first semiconductor element 101, a second semiconductor element 102, an integrated circuit (IC) 103, a wire 104, a bonding material 105, a bonding material 106, a bonding material 107, a lead frame 108, a mold resin 109, and an insulation sheet 110.

The lead frame 108 includes a die pad 121.

The die pad 121 includes a mounting surface 131 and a back surface 132. The mounting surface 131 is a first main surface. The back surface 132 is a second main surface and is located on an opposite side from the mounting surface 131. The mounting surface 131 includes a first mounting region 141 and a second mounting region 142. The back surface 132 includes a first back region 151 and a second back region 152. The first back region 151 is located on an opposite side from the first mounting region 141. The second back region 152 is located on an opposite side from the second mounting region 142.

The first semiconductor element 101 and the second semiconductor element 102 are power semiconductor elements. The power semiconductor element is an element configured to mainly perform switching, such as a metal oxide semiconductor field effect transistor (MOSFET) or an insulated gate bipolar transistor (IGBT).

The second semiconductor element 102 has an amount of heat generation smaller than an amount of heat generation of the first semiconductor element 101. The power semiconductor element is a diode in a standard module.

The first semiconductor element 101 is mounted on the first mounting region 141. The first semiconductor element 101 is bonded to the die pad 121 with the bonding material 105 interposed between the first semiconductor element 101 and the die pad 121. The second semiconductor element 102 is mounted on the second mounting region 142. The second semiconductor element 102 is bonded to the die pad 121 with the bonding material 106 interposed between the second semiconductor element 102 and the die pad 121.

The IC 103 is mounted on the lead frame 108. The IC 103 is bonded to the lead frame 108 with the bonding material 107 interposed between the IC 103 and the lead frame 108.

The wire 104 electrically connects the first semiconductor element 101, the second semiconductor element 102, the IC 103, and the lead frame 108.

The mold resin 109 covers the first semiconductor element 101, the second semiconductor element 102, the IC 103, the wire 104, the bonding material 105, the bonding material 106, the bonding material 107, and the die pad 121. The mold resin 109 has the first semiconductor element 101, the second semiconductor element 102, the IC 103, the wire 104, the bonding material 105, the bonding material 106, the bonding material 107, and the die pad 121 encapsulated therein.

The mold resin 109 is formed by transfer molding.

The insulation sheet 110 is disposed on the first back region 151. The insulation sheet 110 is exposed outside the mold resin 109.

The insulation sheet 110 has a thermal conductivity higher than a thermal conductivity of the mold resin 109. The insulation sheet 110 includes an insulation layer. The insulation layer includes a matrix made of resin and a filler made of ceramics having high thermal conductivity. The filler is dispersed in the matrix.

On the second back region 152, no insulation sheet is disposed. Accordingly, the mold resin 109 is brought into direct contact with the second back region 152 with no insulation sheet interposed between the mold resin 109 and the second back region 152.

According to the first preferred embodiment of the present invention, heat generated by the first semiconductor element 101 that has a large amount of heat generation is satisfactorily dissipated to the outside of the mold resin 109 through the insulation sheet 110 having a thermal conductivity higher than a thermal conductivity of the mold resin 109. This makes it possible to provide the semiconductor device 1 having high heat dissipation.

Further, according to the first preferred embodiment of the present invention, heat generated by the second semiconductor element 102 that has a small amount of heat generation can be satisfactorily dissipated, through the mold resin 109, to the outside of the mold resin 109. Accordingly, the structure where no insulation sheet is disposed on the second back region 152 does not prevent provision of the semiconductor device 1 having high heat dissipation.

Further, according to the first preferred embodiment of the present invention, the first semiconductor element 101, the second semiconductor element 102, the IC 103, the wire 104, and the die pad 121 are satisfactorily insulated from the outside by the mold resin 109 and the insulation sheet 110. This makes it possible to provide the semiconductor device 1 having high insulation.

Further, according to the first preferred embodiment of the present invention, no insulation sheet is disposed on the second back region 152. This makes it possible to reduce an area where the insulation sheet is disposed and in turn makes it possible to reduce the cost of the semiconductor device 1.

2 Second Preferred Embodiment

Figure 2:
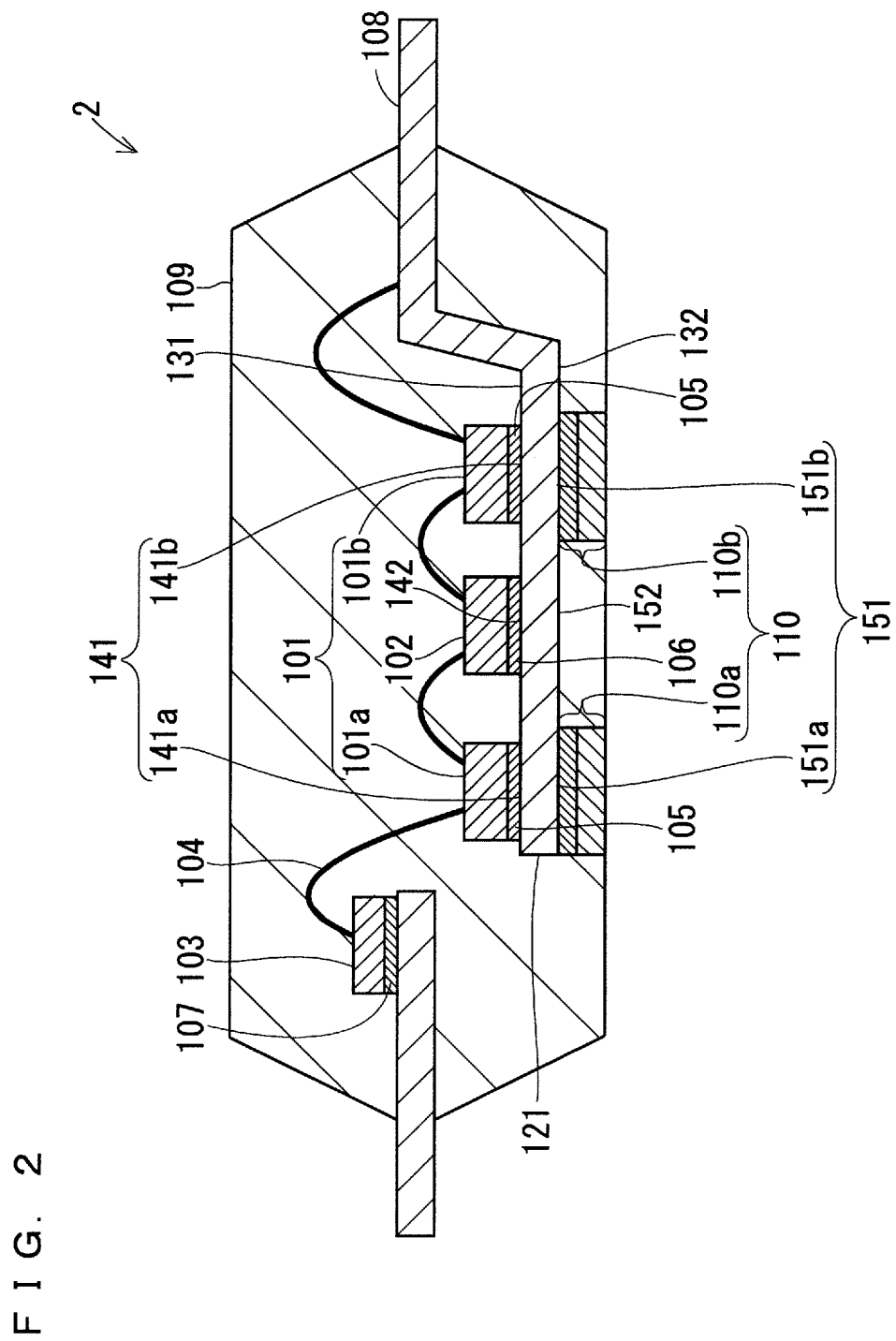
FIG. 2 is a cross-sectional view schematically showing a semiconductor device according to a second preferred embodiment.

FIG. 2 is a cross-sectional view schematically showing a semiconductor device according to a second preferred embodiment.

A semiconductor device 2 according to the second preferred embodiment shown in FIG. 2 is different from the semiconductor device 1 according to the first preferred embodiment shown in FIG. 1 mainly in the following points. As for points no description will be given of, the same structure as employed in the semiconductor device 1 according to the first preferred embodiment is also employed in the semiconductor device 2 according to the second preferred embodiment.

In the semiconductor device 2 according to the second preferred embodiment, the first semiconductor element 101 includes a plurality of semiconductor elements 101a and 101b separated from each other. Further, the first mounting region 141 includes a plurality of mounting regions 141a and 141b separated from each other. Further, the first back region 151 includes a plurality of back regions 151a and 151b separated from each other. Further, the insulation sheet 110 includes a plurality of insulation sheets 110a and 110b separated from each other.

The plurality of semiconductor elements 101a and 101b are mounted on the plurality of mounting regions 141a and 141b, respectively. The plurality of back regions 151a and 151b are located on opposite sides from the plurality of mounting regions 141a and 141b, respectively. The plurality of insulation sheets 110a and 110b are disposed on the plurality of back regions 151a and 151b, respectively.

The number, disposition, and disposition area of the plurality of insulation sheets 110a and 110b are changed based on the number, disposition, and size of the plurality of semiconductor elements 101a and 101b, and thus are not limited to specific number, disposition, and disposition area.

According to the second preferred embodiment of the present invention, similarly to the first preferred embodiment of the present invention, it is possible to provide the semiconductor device 2 having high heat dissipation and to provide the semiconductor device 2 having high insulation. In particular, when a large number of first semiconductor elements are mounted in the semiconductor device 2, it is possible to not only divide the insulation sheet but also reduce the area where the insulation sheet 110 is disposed and in turn makes it possible to reduce the cost of the semiconductor device 2.

In addition, according to the second preferred embodiment of the present invention, the insulation sheet 110 includes the plurality of insulation sheets 110a and 110b separated from each other. This makes it possible to increase a degree of freedom in disposition of the plurality of semiconductor elements 101a and 101b.

3 Third Preferred Embodiment

FIG. 3 is a plan view schematically showing a semiconductor device according to a third preferred embodiment. In FIG. 3, in order to show an internal structure, the mold resin except for its outline is made transparent.

A semiconductor device 3 according to the third preferred embodiment shown in FIG. 3 is different from the semiconductor device 1 according to the first preferred embodiment shown in FIG. 1 or the semiconductor device 2 according to the second preferred embodiment shown in FIG. 2 mainly in the following points. As for points no description will be given of, the same structure as employed in the semiconductor device 1 according to the first preferred embodiment or the semiconductor device 2 according to the second preferred embodiment is also employed in the semiconductor device 3 according to the third preferred embodiment.

To form the mold resin 109 to be provided in the semiconductor device 3 according to the third preferred embodiment, a resin fluid flows into a molding part through a first gate. Part of the resin fluid that has flowed in the molding part hardens in a molding process to become the mold resin 109. The remainder of the resin fluid that has flowed in the molding part flows out of the molding part through a second gate into a resin gathering part provided outside the molding part. This causes the mold resin 109 contained in the molding part to have a first gate resin residue 161 that is located at a position where the first gate is provided and protrudes from a peripheral portion of the mold resin 109. This further causes the mold resin 109 contained in the molding part to have a second gate resin residue 162 that is located at a position where the second gate is provided and protrudes from a peripheral portion of the mold resin 109. The first gate resin residue 161 and the second gate resin residue 162 includes a gate resin residue separated from the first semiconductor element 101 by a first distance and separated from the second semiconductor element 102 by a second distance shorter than the first distance.

The mold resin 109 includes a first surface 171 and a second surface 172. The second surface 172 is located on an opposite side from the first surface 171. The first gate resin residue 161 is located on the first surface 171. The second gate resin residue 162 is located on the second surface 172.

In addition, according to the third preferred embodiment of the present invention, the remainder of the resin fluid flows out of the molding part through the second gate into a resin gathering part (not shown) provided outside the molding part. This makes it possible to increase a time during which the resin fluid flows in the molding part and thus makes it possible to suppress formation of a void, an unfilled portion, or the like in the mold resin 109.

Further, according to the third preferred embodiment of the present invention, the resin fluid can smoothly flow on the second back region 152, which makes it possible to suppress the formation of a void, an unfilled portion, or the like on the second back region 152.

The effect of suppressing the formation of a void, an unfilled portion, or the like clearly appears in an area where a void, an unfilled portion, or the like is easily formed. For example, when a space on the mounting surface 131 is relatively large, and a space on the back surface 132 is relatively small, the resin fluid flows relatively quickly on the mounting surface 131 and flows relatively slowly on the back surface 132. This makes the back surface 132 susceptible to the formation of a void, an unfilled portion, or the like due to, for example, the flow of the resin fluid from the mounting surface 131. Therefore, when the space on the mounting surface 131 is relatively large, and the space on the back surface 132 is relatively small, the effect of suppressing the formation of a void, an unfilled portion, or the like clearly appears on the back surface 132.

In addition, the effect of suppressing the formation of a void, an unfilled portion, or the like clearly appears when, for example, the semiconductor device 3 has a large size or the lead frame 108 has a complicated structure. Therefore, the effect clearly appears when the semiconductor device 3 is an intelligent power module, for example.

According to the third preferred embodiment of the present invention, similarly to the first preferred embodiment of the present invention, it is possible to provide the semiconductor device 3 having high heat dissipation and to provide the semiconductor device 3 having high insulation, and it is possible to reduce the area where the insulation sheet is disposed and in turn makes it possible to reduce the cost of the semiconductor device 3, by virtue of the above-described effects.

4 Fourth Preferred Embodiment

Figure 4:
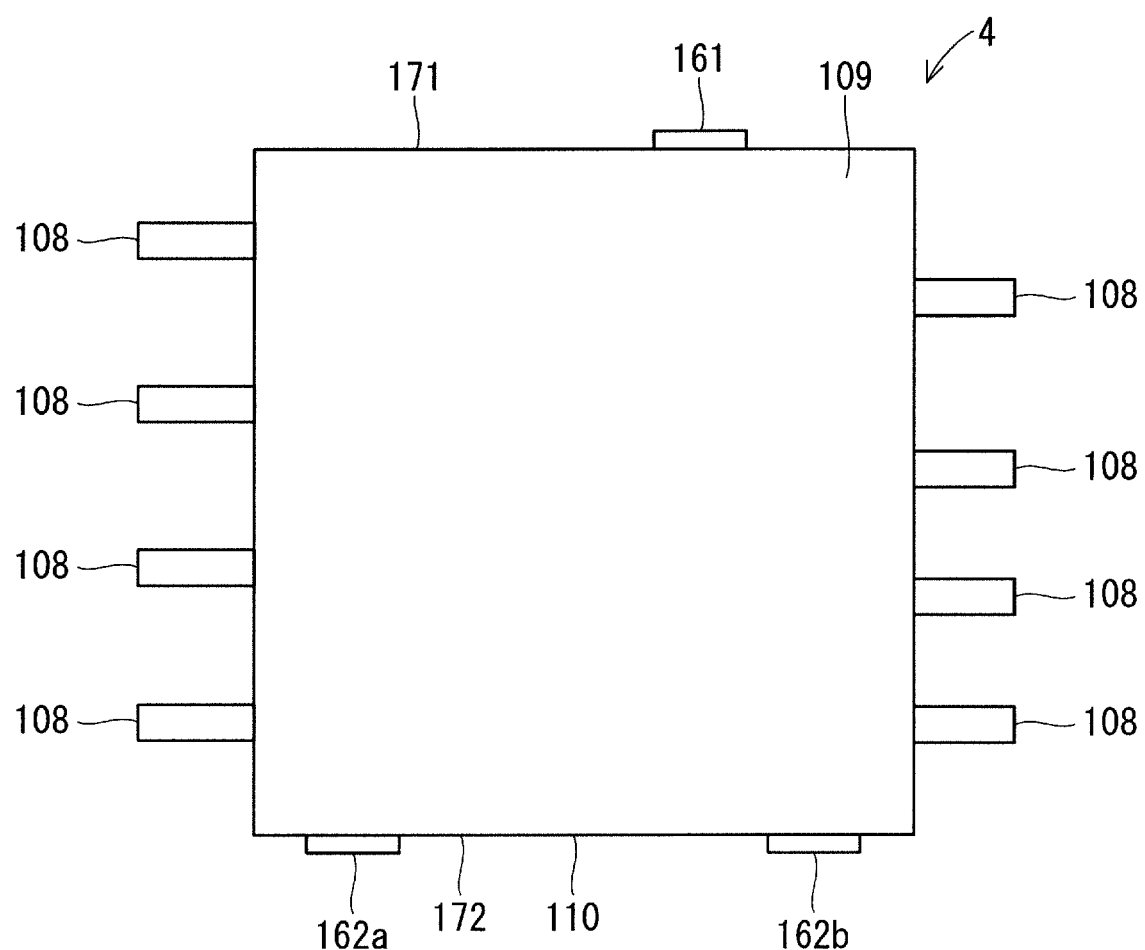
FIG. 4 is a plan view schematically showing a semiconductor device according to a fourth preferred embodiment.

FIG. 4 is a plan view schematically showing a semiconductor device according to a fourth preferred embodiment.

In a semiconductor device 4 according to the fourth preferred embodiment, the second gate resin residue 162 includes a plurality of gate resin residues 162a and 162b separated from each other. The number, position, and size of the plurality of gate resin residues 162a and 162b are changed based on the structure of the semiconductor device 4 and thus are not limited to specific number, position, and size.

5 Fifth Preferred Embodiment

In a semiconductor device 5 according to the fifth preferred embodiment, the number, position, and size of gate resin residues constituting the first gate resin residue 161 are not limited to specific number, position, and size. In the semiconductor device 5 according to the fifth preferred embodiment shown in FIG. 5, the first gate resin residue 161 includes a plurality of gate resin residues 161a, 161b, and 161c separated from each other.

According to the fifth preferred embodiment of the present invention, similarly to the first preferred embodiment of the present invention, it is possible to provide the semiconductor device 5 having high heat dissipation and to provide the semiconductor device 5 having high insulation. In particular, when a large number of first semiconductor elements are mounted in the semiconductor device 5, it is possible to not only divide the insulation sheet as shown in FIG. 5 but also reduce the cost of the semiconductor device 5.

Further, according to the fifth preferred embodiment of the present invention, similarly to the third and fourth preferred embodiments of the present invention, it is possible to suppress the formation of a void, an unfilled portion, or the like in the mold resin 109.

In addition, according to the fifth preferred embodiment of the present invention, the second gate resin residue 162 provided at the position where the second gate is located, the remainder of the resin fluid flowing out of the molding part through the second gate, includes a plurality of gate resin residues 162a, 162b, and 162c separated from each other. This increases a degree of freedom in adjustment of fluidity of the resin fluid and thus makes it easy to adjust the fluidity of the resin fluid to prevent a void, an unfilled portion, or the like from being formed in the mold resin 109.

Note that the present invention can be implemented by any combination of the preferred embodiments within the scope of the present invention, and each of the preferred embodiments can be modified or omitted as appropriate.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a first semiconductor element including a plurality of semiconductor elements separated from each other;
   a second semiconductor element;
   a lead frame including a die pad, the die pad including a mounting surface and a back surface, the mounting surface including a first mounting region including a plurality of mounting regions separated from each other where the plurality of semiconductor elements of the first semiconductor element are mounted and a second mounting region where the second semiconductor element is mounted, the back surface including a first back region including a plurality of back regions separated from each other located on an opposite side from the respective plurality of mounting regions of the first mounting region and a second back region located on an opposite side from the second mounting region;
   a mold resin having the first semiconductor element, the second semiconductor element, and the die pad encapsulated in the mold resin, the mold resin being in direct contact with the second back region; and
   a plurality of insulation sheets respectively disposed on the plurality of back regions of the first back region to be exposed outside the mold resin, the insulation sheets being separated from each other by the mold resin, and the insulation sheets having a thermal conductivity higher than a thermal conductivity of the mold resin.

2. The semiconductor device according to claim 1, wherein the second semiconductor element has an amount of heat generation smaller than an amount of heat generation of the first semiconductor element.

3. A semiconductor device comprising:
   a first semiconductor element;
   a second semiconductor element;
   a lead frame including a die pad, the die pad including a mounting surface and a back surface, the mounting surface including a first mounting region where the first semiconductor element is mounted and a second mounting region where the second semiconductor element is mounted, the back surface including a first back region located on an opposite side from the first mounting region and a second back region located on an opposite side from the second mounting region;
   a mold resin having the first semiconductor element, the second semiconductor element, and the die pad encapsulated in the mold resin, the mold resin being in direct contact with the second back region; and
   an insulation sheet disposed on the first back region to be exposed outside the mold resin, the insulation sheet having a thermal conductivity higher than a thermal conductivity of the mold resin,
   wherein the mold resin includes a first gate resin residue and a second gate resin residue.

4. The semiconductor device according to claim 3, wherein
   the first gate resin residue and the second gate resin residue includes a gate resin residue separated from the first semiconductor element by a first distance and separated from the second semiconductor element by a second distance shorter than the first distance.

5. The semiconductor device according to claim 3, wherein
   the second gate resin residue includes a plurality of gate resin residues separated from each other.

6. A semiconductor device comprising:
   a first power semiconductor element;
   a second power semiconductor element;
   a lead frame including a die pad, the die pad including a mounting surface and a back surface, the mounting surface including a first mounting region where the first power semiconductor element is mounted and a second mounting region where an entirety of the second power semiconductor element is mounted, the back surface including a first back region located on an opposite side from the first mounting region and a second back region located on an opposite side from an entirety of the second mounting region, the first power semiconductor element and the second power semiconductor element located on a continuous planar region of the die pad;
   a mold resin having the first power semiconductor element, the second power semiconductor element, and the die pad encapsulated in the mold resin, the mold resin being in direct contact with the second back region; and
   an insulation sheet disposed on the first back region to be exposed outside the mold resin, the insulation sheet not disposed on any portion of an entirety of the second back region, and the insulation sheet having a thermal conductivity higher than a thermal conductivity of the mold resin.

7. The semiconductor device according to claim 6, wherein the second power semiconductor element has an amount of heat generation smaller than an amount of heat generation of the first power semiconductor element.

8. The semiconductor device according to claim 6, wherein the insulation sheet includes a plurality of insulation sheets separated from each other.

\* \* \* \* \*